United States Patent
Nakazawa et al.

(10) Patent No.: US 11,653,114 B2
(45) Date of Patent: May 16, 2023

(54) PHOTOELECTRIC CONVERSION DEVICE AND IMAGING SYSTEM

(71) Applicant: CANON KABUSHIKI KAISHA, Tokyo (JP)

(72) Inventors: Keigo Nakazawa, Tokyo (JP); Kazuhiro Saito, Tokyo (JP); Tetsuya Itano, Sagamihara (JP); Kazuo Yamazaki, Yokohama (JP); Hideo Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 159 days.

(21) Appl. No.: 16/925,595

(22) Filed: Jul. 10, 2020

(65) Prior Publication Data

US 2021/0021770 A1 Jan. 21, 2021

(30) Foreign Application Priority Data

Jul. 19, 2019 (JP) .............................. JP2019-133490

(51) Int. Cl.
*H04N 5/378* (2011.01)
*H04N 25/617* (2023.01)
(Continued)

(52) U.S. Cl.
CPC ............ *H04N 25/617* (2023.01); *G06T 7/55* (2017.01); *H01L 27/14603* (2013.01);
(Continued)

(58) Field of Classification Search
None
See application file for complete search history.

(56) References Cited

U.S. PATENT DOCUMENTS

| 7,126,102 B2 | 10/2006 | Inoue |
| 7,321,110 B2 | 1/2008 | Okita |

(Continued)

FOREIGN PATENT DOCUMENTS

| JP | 2013-30997 | 2/2013 |
| JP | 2017-55099 | 3/2017 |

OTHER PUBLICATIONS

U.S. Appl. No. 16/990,292, filed Aug. 11, 2020 by Takanori Yamashita et al.

(Continued)

*Primary Examiner* — Howard D Brown, Jr.
(74) *Attorney, Agent, or Firm* — Venable LLP

(57) ABSTRACT

An embodiment includes: a semiconductor substrate including a pixel well region and a peripheral well region; a pixel ground line arranged above the pixel well region; a pixel well contact between the pixel ground line and the pixel well region; pixels arranged to form columns in the pixel well region; a reference signal generation circuit arranged in the peripheral well region; and comparator units arranged in the peripheral well region, provided to respective columns, and each configured to receive the pixel signal from the pixels on a corresponding column and the reference signal. Each comparator unit includes a comparator having a first input node that receives the pixel signal and a second input node that receives the reference signal, a first capacitor unit between the reference signal generation circuit and the second input node, and a second capacitor unit between the second input node and the pixel ground line.

20 Claims, 12 Drawing Sheets

(51) Int. Cl.
  *H01L 27/146* (2006.01)
  *G06T 7/55* (2017.01)
  *H04N 25/67* (2023.01)
  *H04N 25/75* (2023.01)
  *H04N 25/771* (2023.01)
  *H04N 25/778* (2023.01)

(52) U.S. Cl.
  CPC ............ *H04N 25/67* (2023.01); *H04N 25/75* (2023.01); *H04N 25/771* (2023.01); *H04N 25/778* (2023.01); *G06T 2207/30252* (2013.01)

(56) References Cited

U.S. PATENT DOCUMENTS

| | | |
|---|---|---|
| 7,385,172 B2 | 6/2008 | Inoue |
| 7,408,210 B2 | 8/2008 | Ogura |
| 7,423,790 B2 | 9/2008 | Kochi |
| 7,460,162 B2 | 12/2008 | Koizumi |
| 7,462,810 B2 | 12/2008 | Kobayashi |
| 7,528,878 B2 | 5/2009 | Sato |
| 7,550,793 B2 | 6/2009 | Itano |
| 7,592,579 B2 | 9/2009 | Tamura |
| 7,709,780 B2 | 5/2010 | Inoue |
| 7,719,587 B2 | 5/2010 | Ogura |
| 7,741,593 B2 | 6/2010 | Iwata |
| 7,816,755 B2 | 10/2010 | Yamazaki |
| 7,825,974 B2 | 11/2010 | Itano |
| 7,889,254 B2 | 2/2011 | Koichi |
| 7,920,192 B2 | 4/2011 | Watanabe |
| 7,978,241 B2 | 7/2011 | Koizumi |
| 7,982,789 B2 | 7/2011 | Watanabe |
| 7,990,440 B2 | 8/2011 | Kobayashi |
| 8,023,025 B2 | 9/2011 | Itano |
| 8,049,799 B2 | 11/2011 | Sonoda |
| 8,063,351 B2 | 11/2011 | Kobayashi |
| 8,063,958 B2 | 11/2011 | Okita |
| 8,063,967 B2 | 11/2011 | Itano |
| 8,081,245 B2 | 12/2011 | Itano |
| 8,085,319 B2 | 12/2011 | Ono |
| 8,159,577 B2 | 4/2012 | Iwata |
| 8,289,432 B2 | 10/2012 | Itano |
| 8,325,260 B2 | 12/2012 | Yamazaki |
| 8,355,066 B2 | 1/2013 | Iwata |
| 8,363,137 B2 | 1/2013 | Sonoda |
| 8,368,790 B2 | 2/2013 | Itano |
| 8,390,708 B2 | 3/2013 | Koizumi |
| 8,400,546 B2 | 3/2013 | Itano |
| 8,411,187 B2 | 4/2013 | Watanabe |
| 8,441,558 B2 | 5/2013 | Okita |
| 8,553,118 B2 | 10/2013 | Saito |
| 8,598,901 B2 | 12/2013 | Hiyama |
| 8,670,049 B2 | 3/2014 | Ono |
| 8,698,935 B2 | 4/2014 | Okita |
| 8,710,558 B2 | 4/2014 | Inoue |
| 8,711,259 B2 | 4/2014 | Maehashi |
| 8,749,675 B2 | 6/2014 | Koizumi |
| 8,760,337 B2 | 6/2014 | Yamazaki |
| 8,810,706 B2 | 8/2014 | Yamazaki |
| 8,835,828 B2 | 9/2014 | Kobayashi |
| 8,836,313 B2 | 9/2014 | Takagi |
| 8,836,838 B2 | 9/2014 | Nakamura |
| 8,884,391 B2 | 11/2014 | Fudaba |
| 8,896,029 B2 | 11/2014 | Koizumi |
| 8,928,786 B2 | 1/2015 | Iwata |
| 9,029,752 B2 | 5/2015 | Saito |
| 9,060,139 B2 | 6/2015 | Yamazaki |
| 9,083,906 B2 | 7/2015 | Nakamura |
| 9,118,857 B2 | 8/2015 | Iwata |
| 9,232,165 B2 | 1/2016 | Saito |
| 9,264,641 B2 | 2/2016 | Kobayashi |
| 9,288,415 B2 | 3/2016 | Yamazaki |
| 9,305,954 B2 | 4/2016 | Kato |
| 9,337,222 B2 | 5/2016 | Saito |
| 9,357,122 B2 | 5/2016 | Kususaki |
| 9,407,847 B2 | 8/2016 | Maehashi |
| 9,438,828 B2 | 9/2016 | Itano |
| 9,438,841 B2 | 9/2016 | Yamazaki |
| 9,509,931 B2 | 11/2016 | Kobayashi |
| 9,602,752 B2 | 3/2017 | Kobayashi |
| 9,602,753 B2 | 3/2017 | Saito |
| 9,667,901 B2 | 5/2017 | Sakai |
| 9,681,076 B2 | 6/2017 | Oguro |
| 9,762,840 B2 | 9/2017 | Yamazaki |
| 9,825,077 B2 | 11/2017 | Watanabe |
| 9,900,539 B2 | 2/2018 | Yamasaki |
| 10,015,430 B2 | 7/2018 | Kobayashi |
| 10,051,223 B2 | 8/2018 | Yamashita |
| 10,057,529 B2 | 8/2018 | Saito |
| 10,194,103 B2 | 1/2019 | Saito |
| 10,403,658 B2 | 9/2019 | Takada |
| 10,531,033 B2 | 1/2020 | Morita |
| 10,609,243 B2 | 3/2020 | Ochiai |
| 10,609,316 B2 | 3/2020 | Kobayashi |
| 10,609,320 B2 | 3/2020 | Kuroda |
| 10,645,325 B2 | 5/2020 | Takado |
| 10,652,531 B2 | 5/2020 | Kono |
| 10,778,920 B2 | 9/2020 | Yamashita |
| 2011/0003426 A1 | 1/2011 | Watanabe |
| 2012/0013778 A1 | 1/2012 | Sonoda |
| 2012/0175503 A1 | 7/2012 | Kuroda |
| 2013/0002916 A1 | 1/2013 | Itano |
| 2013/0026343 A1* | 1/2013 | Saito ................. H01L 27/14609 250/208.1 |
| 2013/0140440 A1 | 6/2013 | Kobayashi |
| 2015/0122975 A1 | 5/2015 | Saito |
| 2016/0227141 A1 | 8/2016 | Kobayashi |
| 2017/0078603 A1* | 3/2017 | Yamasaki ......... H01L 27/14641 |
| 2018/0197907 A1 | 7/2018 | Wada |
| 2019/0141266 A1 | 5/2019 | Itano |
| 2019/0166323 A1 | 5/2019 | Saito |
| 2019/0394416 A1 | 12/2019 | Kobayashi |
| 2020/0066772 A1 | 2/2020 | Kobayashi |
| 2020/0084397 A1 | 3/2020 | Yamazaki |
| 2020/0186738 A1 | 6/2020 | Takada |
| 2020/0228741 A1 | 7/2020 | Takado |
| 2020/0236348 A1 | 7/2020 | Kono |
| 2020/0314360 A1 | 10/2020 | Sakai |

OTHER PUBLICATIONS

U.S. Appl. No. 16/884,236, filed May 27, 2020 by Hideo Kobayashi et al.

U.S. Appl. No. 16/928,202, filed Jul. 14, 2020 by Hideo Kobayashi et al.

U.S. Appl. No. 16/917,513, filed Jun. 30, 2020 by Masaki Sato et al.

* cited by examiner

PHOTOELECTRIC CONVERSION DEVICE AND IMAGING SYSTEM

BACKGROUND OF THE INVENTION

Field of the Invention

The present invention relates to a photoelectric conversion device and an imaging system.

Description of the Related Art

Photoelectric conversion devices such as a CMOS image sensor or the like with built-in analog-to-digital (AD) converter circuits have been used as image input devices of a digital camera or the like. Some AD converter circuits built in photoelectric conversion devices compare a pixel signal on each column with a common reference signal (ramp signal) to obtain digital data. Japanese Patent Application Laid-Open No. 2013-030997 discloses a technology, in the AD converter circuit using a ramp signal, for suppressing horizontal stripe noise due to noise that does not depend on the slope of the ramp signal when the AD conversion gain is switched by changing the slope of the ramp signal.

Further, in recent years, higher image quality of a photoelectric conversion device is desired, and it is demanded to suppress noise components superimposed on a pixel signal as much as possible. One of the noise components superimposed on a pixel signal may be magnetic noise occurring on a ground line. Japanese Patent Application Laid-Open No. 2017-055099 discloses a technique of connecting a ground electrode of a capacitor that holds a reference signal to a pixel ground line and thereby suppressing influence of magnetic noise occurring on a ground line.

In the technique disclosed in Japanese Patent Application Laid-Open No. 2013-030997, however, influence of magnetic noise occurring on a ground line is not considered. Thus, when magnetic noise is superimposed on a pixel ground line, this may appear as noise on the output of a comparator forming an AD converter circuit. Further, in Japanese Patent Application Laid-Open No. 2017-055099, the influence of magnetic noise in an AD converter circuit using a ramp signal is not considered.

SUMMARY OF THE INVENTION

The present invention intends to provide a photoelectric conversion device that may reduce influence of magnetic noise superimposed on a ground line while suppressing horizontal stripe noise due to a reference signal generation circuit.

According to one aspect of the present invention, provided is a photoelectric conversion device including a semiconductor substrate including a pixel well region and a peripheral well region, a pixel ground line arranged above the pixel well region, a pixel well contact connected between the pixel ground line and the pixel well region, a plurality of pixels arranged to form a plurality of columns in the pixel well region and each configured to output a pixel signal in accordance with a light amount of incident light, a reference signal generation circuit arranged in the peripheral well region and configured to generate a reference signal having a predetermined amplitude, and a plurality of comparator units arranged in the peripheral well region, provided to corresponding ones of the plurality of columns, and each configured to receive the pixel signal from the pixels on a corresponding column and the reference signal, wherein each of the plurality of comparator units includes a comparator having a first input node that receives the pixel signal and a second input node that receives the reference signal, a first capacitor unit connected between the reference signal generation circuit and the second input node, and a second capacitor unit connected between the second input node and the pixel ground line.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

A photoelectric conversion device and a method of driving the same according to a first embodiment of the present invention will be described with reference to FIG. 1 to FIG. 6.

Figure 1:
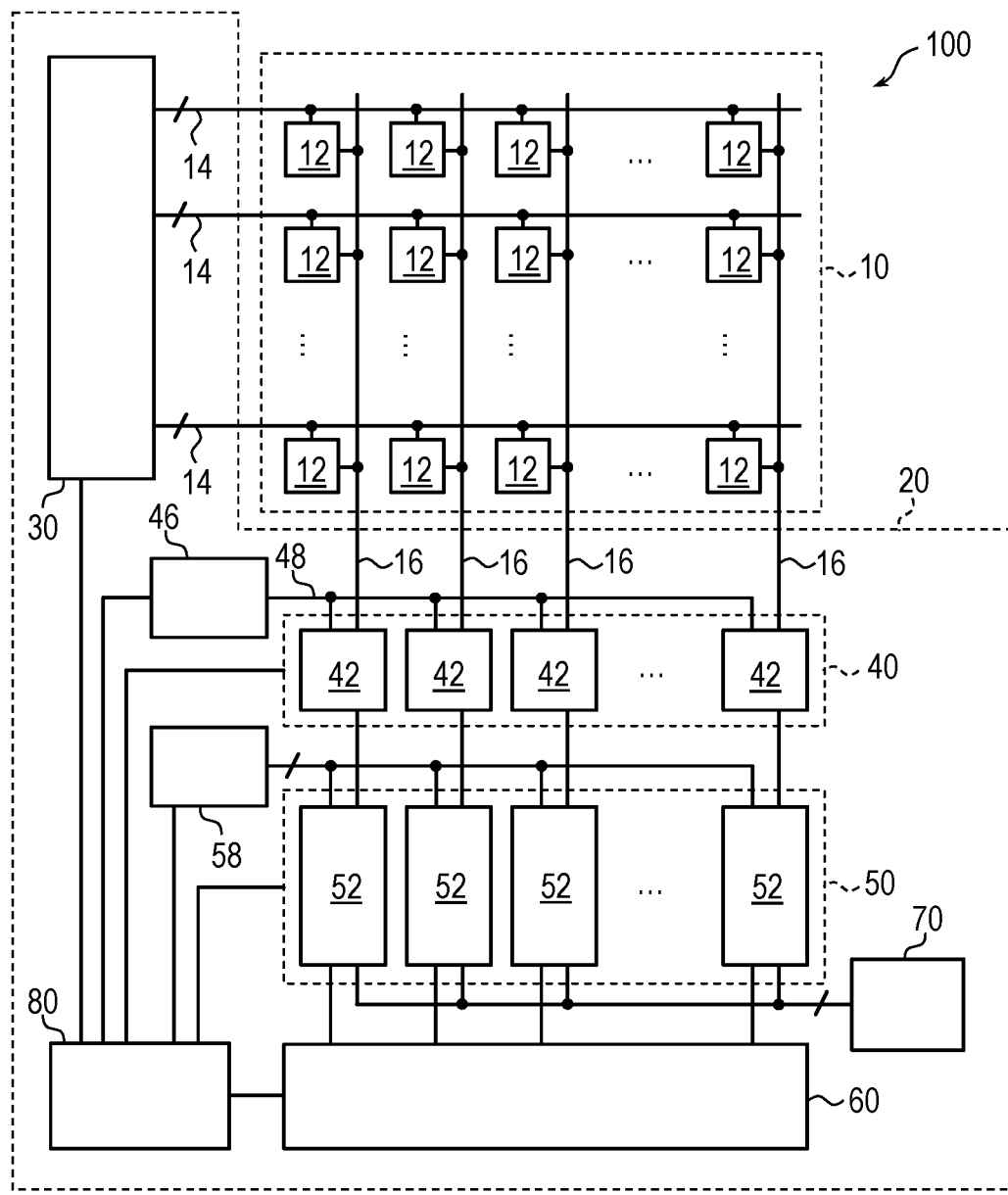
FIG. 1 is a block diagram illustrating a general configuration of a photoelectric conversion device according to a first embodiment of the present invention.
Figure 2:
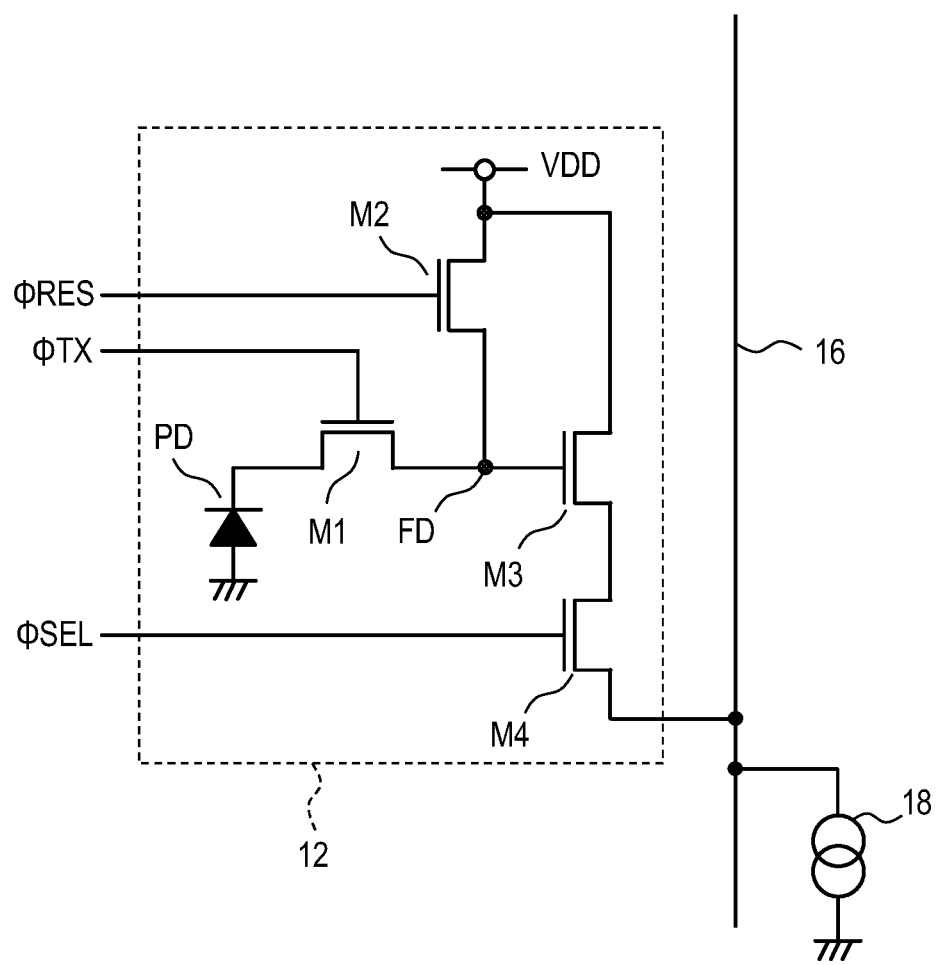
FIG. 2 is a circuit diagram illustrating a configuration example of a pixel in the photoelectric conversion device according to the first embodiment of the present invention.
Figure 3:
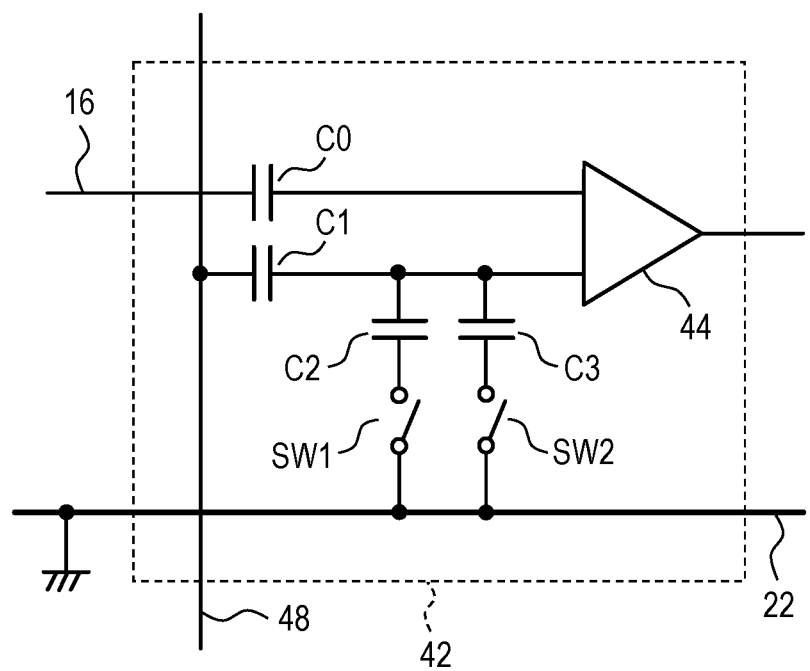
FIG. 3 is a circuit diagram illustrating a configuration example of a comparator unit in the photoelectric conversion device according to the first embodiment of the present invention.

First, a general configuration of the photoelectric conversion device according to the present embodiment will be described with reference to FIG. 1 to FIG. 3. FIG. 1 is a block diagram illustrating a general configuration of the photoelectric conversion device according to the present embodiment. FIG. 2 is a circuit diagram illustrating a configuration example of a pixel in the photoelectric conversion device according to the present embodiment. FIG. 3 is a circuit diagram illustrating a configuration example of a comparator unit in the photoelectric conversion device according to the present embodiment.

As illustrated in FIG. 1, a photoelectric conversion device 100 according to the present embodiment includes a pixel unit 10 and a peripheral circuit unit 20. The peripheral circuit unit 20 includes a vertical scanning circuit 30, a comparator circuit 40, a reference signal generation circuit 46, a storage circuit 50, a counter circuit 58, a horizontal scanning circuit 60, a signal processing circuit 70, and a control circuit 80.

In the pixel unit 10, a plurality of pixels 12 arranged in a matrix to form a plurality of rows and a plurality of columns are provided. Each of the pixels 12 includes a photoelectric converter formed of a photoelectric conversion element such as a photodiode and outputs a pixel signal in accordance with a light amount of incident light. The number of rows and the number of columns of a pixel array arranged in the pixel unit 10 are not particularly limited. Further, in the pixel unit 10, an optical black pixel in which a photoelectric converter is shielded from light, a dummy pixel that outputs no signal, or the like may be arranged in addition to effective pixels that output pixel signals in accordance with a light amount of incident light.

On each row of the pixel array of the pixel unit 10, a control line 14 is arranged extending in a first direction (the horizontal direction in FIG. 1). Each control line 14 is connected to the pixels 12 aligned in the first direction, respectively, to form a signal line common to these pixels 12. The first direction in which the control line 14 extends may be referred to as a row direction or a horizontal direction. The control lines 14 are connected to the vertical scanning circuit 30.

On each column of the pixel array of the pixel unit 10, an output line 16 is arranged extending in a second direction (the vertical direction in FIG. 1) intersecting the first direction. Each output line 16 is connected to the pixels 12 aligned in the second direction, respectively, to form a signal line common to these pixels 12. The second direction in which the output line 16 extends may be referred to as a column direction or a vertical direction. The output lines 16 are connected to the comparator circuit 40.

The vertical scanning circuit 30 is a control circuit unit that supplies control signals, which are used for driving readout circuits within the pixels 12 when signals are read out from the pixels 12, to the pixels 12 via the control lines 14 provided on respective rows of the pixel array. The vertical scanning circuit 30 can be formed of a shift register or an address decoder. The vertical scanning circuit 30 drives the pixels 12 of the pixel unit 10 on a row basis by using control signals supplied via the control lines 14. The signals read out from the pixels 12 on a row basis are input to the comparator circuit 40 via the output lines 16 provided on respective columns of the pixel array.

The comparator circuit 40 includes a plurality of comparator units 42 provided to respective columns of the pixel array of the pixel unit 10. The comparator unit 42 on each column compares the level of a pixel signal read out from the pixel 12 on the corresponding column via the output line 16 with the level of a reference signal output from the reference signal generation circuit 46 and outputs a signal in accordance with a result of the comparison to the storage circuit 50. Specifically, the comparator unit 42 compares the level of a pixel signal with the level of the reference signal and, when the relationship of these signals is inverted, causes the output signal to transition from a high level to a low level or a low level to a high level.

The reference signal generation circuit 46 is connected to the comparator units 42 on respective columns via a reference signal line 48. The reference signal generation circuit 46 outputs a reference signal having a predetermined amplitude to the comparator units 42 on respective columns via the reference signal line 48. The reference signal line 48 transmits the reference signal output from the reference signal generation circuit 46. The reference signal may be a signal whose signal level (the level of the signal) changes with a lapse of time, for example. Typically, the reference signal is a ramp signal. A ramp signal is a signal whose signal level changes monotonically with a lapse of time, and the output voltage monotonically decreases or otherwise monotonically increases with a lapse of time, for example.

The storage circuit 50 includes a plurality of storage units 52 provided to respective columns of the pixel array of the pixel unit 10. The storage unit 52 on each column stores, as digital data, a count value indicated by a count signal that is being output from the counter circuit 58 at a timing of inversion of the signal level of an output signal of the comparator unit 42 on a corresponding column. The digital data stored in the storage unit 52 on each column may include two types of data, namely, a reference signal N and an effective signal S of a pixel signal.

The counter circuit 58 is connected to the storage unit 52 on each column. The counter circuit 58 starts a count operation in synchronization with a timing of start of a change in the signal level of the reference signal output from the reference signal generation circuit 46 and outputs a count signal indicating the count value to the storage unit 52 on each column.

In such a way, the comparator circuit 40 and the storage circuit 50 form an AD converter circuit that performs analog-to-digital conversion on a pixel signal output from the pixel 12 from an analog signal to a digital signal.

The horizontal scanning circuit 60 is a circuit unit that supplies, to the storage circuit 50, control signals used for transferring digital data stored in the storage circuit 50 to the signal processing circuit 70 sequentially on a column basis. The horizontal scanning circuit 60 can be formed of a shift register or an address decoder.

The signal processing circuit 70 is a circuit unit that is formed of a buffer amplifier, a differential amplifier, or the like and performs predetermined signal processing on a signal of a column selected by the horizontal scanning circuit 60. The signal processing performed by the signal processing circuit 70 may be an amplification process, a digital correlated double sampling (CDS) process, or the like. The digital CDS process is signal processing to perform a differential process of (S−N) when the storage circuit 50 stores two types of digital data, namely, the reference signal N and the effective signal S as a pixel signal.

The control circuit 80 is a circuit unit that supplies, to the vertical scanning circuit 30, the comparator circuit 40, the reference signal generation circuit 46, the storage circuit 50, the counter circuit 58, and the horizontal scanning circuit 60, control signals to control the operation or the timing of these circuits. Some or all of the control signals supplied to the vertical scanning circuit 30, the comparator circuit 40, the reference signal generation circuit 46, the storage circuit 50, the counter circuit 58, and the horizontal scanning circuit 60 may be supplied from the outside of the photoelectric conversion device 100.

As illustrated in FIG. 2, for example, each of the plurality of pixels 12 forming the pixel unit 10 may be formed of a photoelectric converter PD, a transfer transistor M1, a reset transistor M2, an amplifier transistor M3, and a select transistor M4.

The photoelectric converter PD is a photodiode, for example, the anode is connected to the ground node, and the cathode is connected to the source of the transfer transistor M1. The drain of the transfer transistor M1 is connected to the source of the reset transistor M2 and the gate of the amplifier transistor M3. The connection node of the drain of the transfer transistor M1, the source of the reset transistor M2, and the gate of the amplifier transistor M3 is a so-called floating diffusion portion FD. The floating diffusion portion FD includes a capacitance component (floating diffusion capacitance) and has a function as a charge holding unit.

The drain of the reset transistor M2 and the drain of the amplifier transistor M3 are connected to a power source node supplied with a voltage VDD. The source of the amplifier transistor M3 is connected to the drain of the select transistor M4. The source of the select transistor M4 is connected to the output line 16. The output line 16 is connected to a current source 18.

In the case of the pixel configuration illustrated in FIG. 2, the control line 14 on each row arranged in the pixel unit 10 includes a transfer gate signal line, a reset signal line, and a select signal line. The transfer gate signal line is connected to the gate of the transfer transistor M1 of the pixels 12 belonging to a corresponding row. The reset signal line is connected to the gate of the reset transistor M2 of the pixels 12 belonging to a corresponding row. The select signal line is connected to the gate of the select transistor M4 of the pixels 12 belonging to a corresponding row.

A control signal ΦTX used for controlling the transfer transistor M1 is output to the transfer gate signal line from the vertical scanning circuit 30. A control signal ΦRES used for controlling the reset transistor M2 is output to the reset signal line from the vertical scanning circuit 30. A control signal ΦSEL used for controlling the select transistor M4 is output to the select signal line from the vertical scanning circuit 30. The common control signal is supplied to the pixels 12 on the same row from the vertical scanning circuit 30. When each transistor is formed of an n-channel transistor, the corresponding transistor is turned on when a high-level control signal is supplied from the vertical scanning circuit 30, and the corresponding transistor is turned off when a low-level control signal is supplied from the vertical scanning circuit 30.

The photoelectric converter PD converts (photoelectrically converts) incident light into an amount of charges in accordance with the light amount and accumulates generated charges. When turned on, the transfer transistor M1 transfers charges held in the photoelectric converter PD to the floating diffusion portion FD. The voltage of the floating diffusion portion FD becomes a voltage in accordance with the amount of charges transferred from the photoelectric converter PD due to charge-to-voltage conversion caused by the capacitance of the floating diffusion portion FD. The amplifier transistor M3 is configured such that the voltage VDD is supplied to the drain and a bias current is supplied to the source from the current source 18 via the select transistor M4 and forms an amplifier unit (source follower circuit) whose gate is the input node. This causes the amplifier transistor M3 to output a signal in accordance with the voltage of the floating diffusion portion FD to the output line 16 via the select transistor M4. When turned on, the reset transistor M2 resets the floating diffusion portion FD to a voltage in accordance with the voltage VDD.

For example, as illustrated in FIG. 3, the comparator unit 42 on each column of the comparator circuit 40 may be formed of a differential input type comparator 44, capacitors C0, C1, C2, and C3, and switches SW1 and SW2.

The comparator 44 has two input nodes and one output node. One input node of the comparator 44 is connected to the output line 16 on a corresponding column via the capacitor C0. The other input node of the comparator 44 is connected to the reference signal line 48 via the capacitor C1. The output terminal of the comparator 44 is connected to the storage unit 52 on the corresponding column. Further, a series-connected component in which the capacitor C2 and the switch SW1 are connected in series and a series-connected component in which the capacitor C3 and the switch SW2 are connected in series are connected in parallel between the other input node of the comparator 44 and the ground node. The control nodes of the switches SW1 and SW2 are connected to the control circuit 80. Note that the interconnection connected between the switches SW1 and SW2 and the ground node is a pixel ground line 22 described later.

The switches SW1 and SW2 each have a connection state (conduction/nonconduction) controlled by a control signal from the control circuit 80 to switch a capacitor element connected between the input node of the comparator 44 and the ground node. That is, the capacitors C2 and C3 and the switches SW1 and SW2 form a capacitor unit that defines the capacitance between the input node of the comparator 44 and the ground node. Accordingly, the reference signal supplied from the reference signal generation circuit 46 changes the amplitude thereof in accordance with capacitance division by the capacitor unit formed of the capacitor C1 and the capacitor unit formed of the capacitors C2 and C3 and the switches SW1 and SW2.

That is, the capacitors C1, C2, and C3 and the switches SW1 and SW2 form a reference signal amplitude conversion circuit that changes the amplitude of the reference signal supplied from the reference signal generation circuit 46. Accordingly, the reference signal supplied from the reference signal generation circuit 46 is controlled to have a predetermined amplitude by this reference signal amplitude conversion circuit and then input to the comparator 44.

When it is assumed that the ratio of the capacitances of the capacitors C1, C2, and C3 is 1:1:2, the amplitude of the reference signal input from the reference signal line 48 to the comparator 44 via the reference signal amplitude conversion circuit can be expressed by Equation (1) to Equation (3) below, for example. Herein, the amplitude VRMP is an amplitude of the reference signal output from the reference signal generation circuit 46. The amplitude RMPD is the amplitude of the reference signal input to the comparator 44 when both the switches SW1 and SW2 are in the off-state (when the gain is set to one-fold). The amplitude RMPE is the amplitude of the reference signal input to the comparator 44 when the switch SW1 is in the on-state and the switch SW2 is in the off-state (when the gain is set to two-fold). The amplitude RMPF is the amplitude of the reference signal input to the comparator 44 when both the switches SW1 and SW2 are in the on-state (when the gain is set to four-fold). Note that, for simplified illustration in the following equations, the parasitic capacitance of each terminal is omitted.

$$RMPD = VRMP \times (1) \quad (1)$$

$$RMPE = VRMP \times (\tfrac{1}{2}) \quad (2)$$

$$RMPF = VRMP \times (\tfrac{1}{4}) \quad (3)$$

Figure 4:
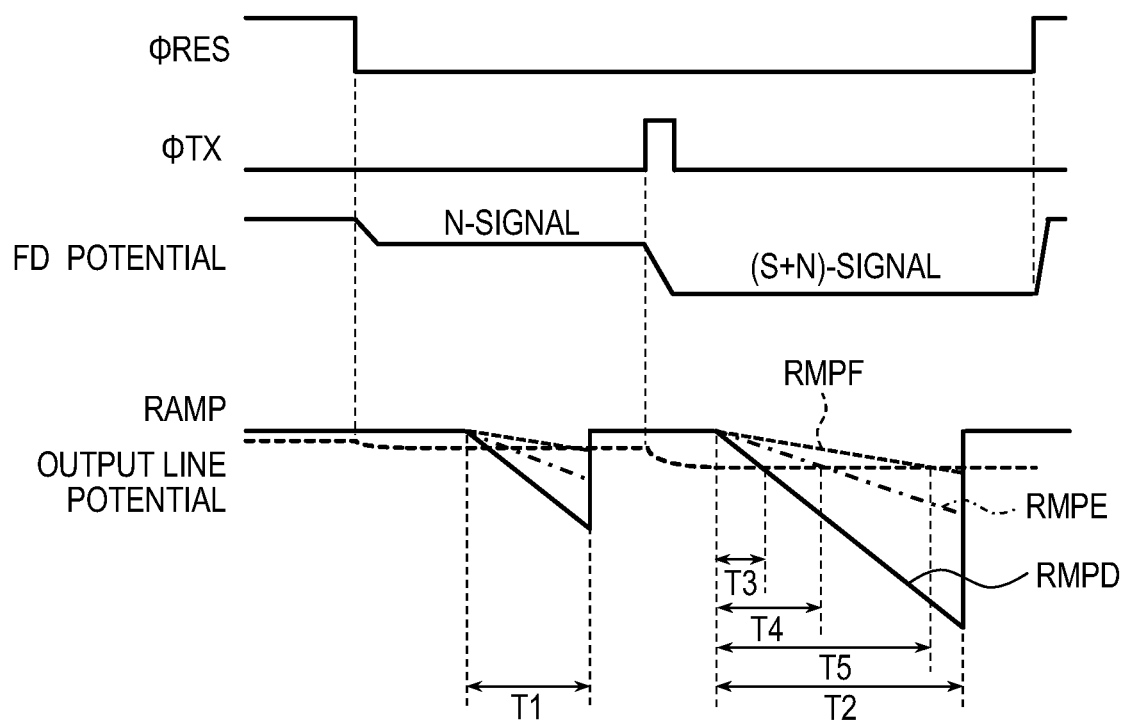
FIG. 4 is a timing chart illustrating the operation of the photoelectric conversion device according to the first embodiment of the present invention.

Next, the operation of the photoelectric conversion device according to the present embodiment will be described with reference to FIG. 4. FIG. 4 is a timing chart illustrating the operation of the photoelectric conversion device according to the present embodiment. FIG. 4 illustrates the operation of the pixel 12 and the operation of the comparator circuit 40 for one row out of the plurality of pixel rows forming the pixel unit 10. Note that, although not depicted in FIG. 4, it is assumed that the control signal ΦSEL corresponding to a row from which a pixel signal is read out is maintained at the high level during the depicted period.

First, the control signal ΦRES supplied to the control line 14 on a pixel row on which readout is performed is controlled from the high level to the low level by the vertical scanning circuit 30, and the reset transistor M2 of the pixel 12 belonging to the pixel row is turned off. Thereby, the potential of the floating diffusion portion FD becomes a reset potential in accordance with the voltage VDD, and a reset signal in accordance with the reset potential (hereafter, referred to as "N-signal") is output to the output line 16.

In the subsequent period T1, a first AD conversion process is performed on the N-signal output to the output line 16. The comparator 44 compares the level of the N-signal and the level of the ramp signal RAMP and, when the relationship of the ramp signal RAMP and the N-signal is inverted, causes the output to transition from a high level to a low level or otherwise a low level to a high level. The counter circuit 58 starts counting from the start of a change in the signal level of the ramp signal RAMP (the start of the period T1) and outputs a count signal in accordance with the count value to the storage unit 52. The storage unit 52 stores, as first digital data, the count value of the count signal that is being output from the counter circuit 58 at a timing of inversion of the output of the comparator 44.

After completion of the first AD conversion process, the control signal ΦTX supplied to the control line 14 on a pixel row on which readout is performed is controlled from the low level to the high level by the vertical scanning circuit 30, and the transfer transistor M1 of the pixel 12 belonging to the pixel row is turned on. Thereby, charges accumulated in the photoelectric converter PD are transferred to the floating diffusion portion FD, and the potential of the output line 16 changes to a potential in accordance with the amount of charges transferred from the photoelectric converter PD to the floating diffusion portion FD. At this time, a signal corresponding to the sum of the N-signal and a signal in accordance with the amount of charges generated in the photoelectric converter PD appears on the output line 16. Hereafter, this signal is referred to as "(S+N)-signal".

In the subsequent period T2, a second AD conversion process is performed on the (S+N)-signal output to the output line. The comparator 44 compares the level of the (S+N)-signal and the level of the ramp signal RAMP and, when the relationship of the ramp signal RAMP and the (S+N)-signal is inverted, causes the output to transition from the high level to the low level or otherwise the low level to the high level. The counter circuit 58 starts counting from the start of a change in the signal level of the ramp signal RAMP (the start of the period T2) and outputs a count signal in accordance with the count value to the storage unit 52. The storage unit 52 stores, as second digital data, the count value of the count signal that is being output from the counter circuit 58 at a timing of inversion of the output of the comparator 44.

After completion of the second AD conversion process, the control signal ΦRES supplied to the control line 14 on a pixel row on which readout is performed is controlled from the low level to the high level by the vertical scanning circuit 30, and the reset transistor M2 of the pixel 12 belonging to the pixel row is turned on. Thereby, the potential of the floating diffusion portion FD becomes a potential in accordance with the voltage VDD, and the gate node of the amplifier transistor M3 is in a reset state.

The first digital data and the second digital data stored in the storage unit 52 on each column are transferred to the signal processing circuit 70 subsequently on a column basis in accordance with the control signal from the horizontal scanning circuit 60. In the signal processing circuit 70, a differential process to subtract the value represented by the first digital data from the value represented by the second digital data is performed, and the characteristic variation among the comparator units 42 on respective columns is removed. Note that signal processing including a differential process may be performed by a signal processing device outside the photoelectric conversion device 100 without the differential process being performed in the signal processing circuit 70.

The amplitude (slope) of the ramp signal RAMP can be changed by appropriately controlling the switches SW1 and SW2 of the comparator unit 42 as described above. By changing the amplitude (slope) of the ramp signal RAMP input to the comparator 44, it is possible to switch the AD conversion gain.

That is, when both the switches SW1 and SW2 are in the off-state, the amplitude of the ramp signal RAMP is the amplitude RMPD that is the same as the amplitude VRMP of the ramp signal output from the reference signal generation circuit 46. At this time, the period from the start of the second AD conversion process to the inversion of the relationship between the ramp signal RAMP and the (S+N)-signal is a period T3.

When the switch SW1 is in the on-state and the switch SW2 is in the off-state, the amplitude of the ramp signal RAMP is the amplitude RMPE that is ½ times the amplitude VRMP of the ramp signal output from the reference signal generation circuit 46. At this time, the period from the start of the second AD conversion process to the inversion of the relationship between the ramp signal RAMP and the (S+N)-signal is a period T4. The value of the second digital data obtained when the ramp signal RAMP with the amplitude RMPE is used is two times the value of the second digital data obtained when the ramp signal RAMP with the amplitude RMPD is used.

When both the switches SW1 and SW2 are in the on-state, the amplitude of the ramp signal RAMP is the amplitude RMPF that is ¼ times the amplitude VRMP of the ramp signal output from the reference signal generation circuit 46. At this time, the period from the start of the second AD conversion process to the inversion of the relationship between the ramp signal RAMP and the (S+N)-signal is a period T5. The value of the second digital data obtained when the ramp signal RAMP with the amplitude RMPF is used is four times the value of the second digital data obtained when the ramp signal RAMP with the amplitude RMPD is used.

When a plurality of ramp signals are used in an AD conversion circuit, accuracy of an individual ramp signal and relative accuracy between ramp signals significantly affect an AD conversion error. For example, when the amplitude of a ramp signal is changed at and output from a ramp signal source, since noise occurring in an output buffer stage of the ramp signal source does not depend on the amplitude of the ramp signal, noise superimposed on the ramp signal is constant even when the amplitudes of ramp signals differ on a pixel row basis. As a result, large horizontal stripe noise may be detected on a pixel row basis.

In this regard, in the photoelectric conversion device of the present embodiment, the degree of noise superimposed on the ramp signal RAMP input to the comparator 44 changes in the same manner as the amplitude (slope) of the ramp signal RAMP. That is, when the amplitude (slope) of the ramp signal RAMP changes to 1-fold, ½-fold, and ¼-fold, the noise superimposed on the ramp signal RAMP will also be 1-fold, ½-fold, and ¼-fold. Therefore, according to the photoelectric conversion device of the present embodiment, it is possible to suppress occurrence of horizontal stripe noise due to noise superimposed on the ramp signal RAMP.

Figure 5:
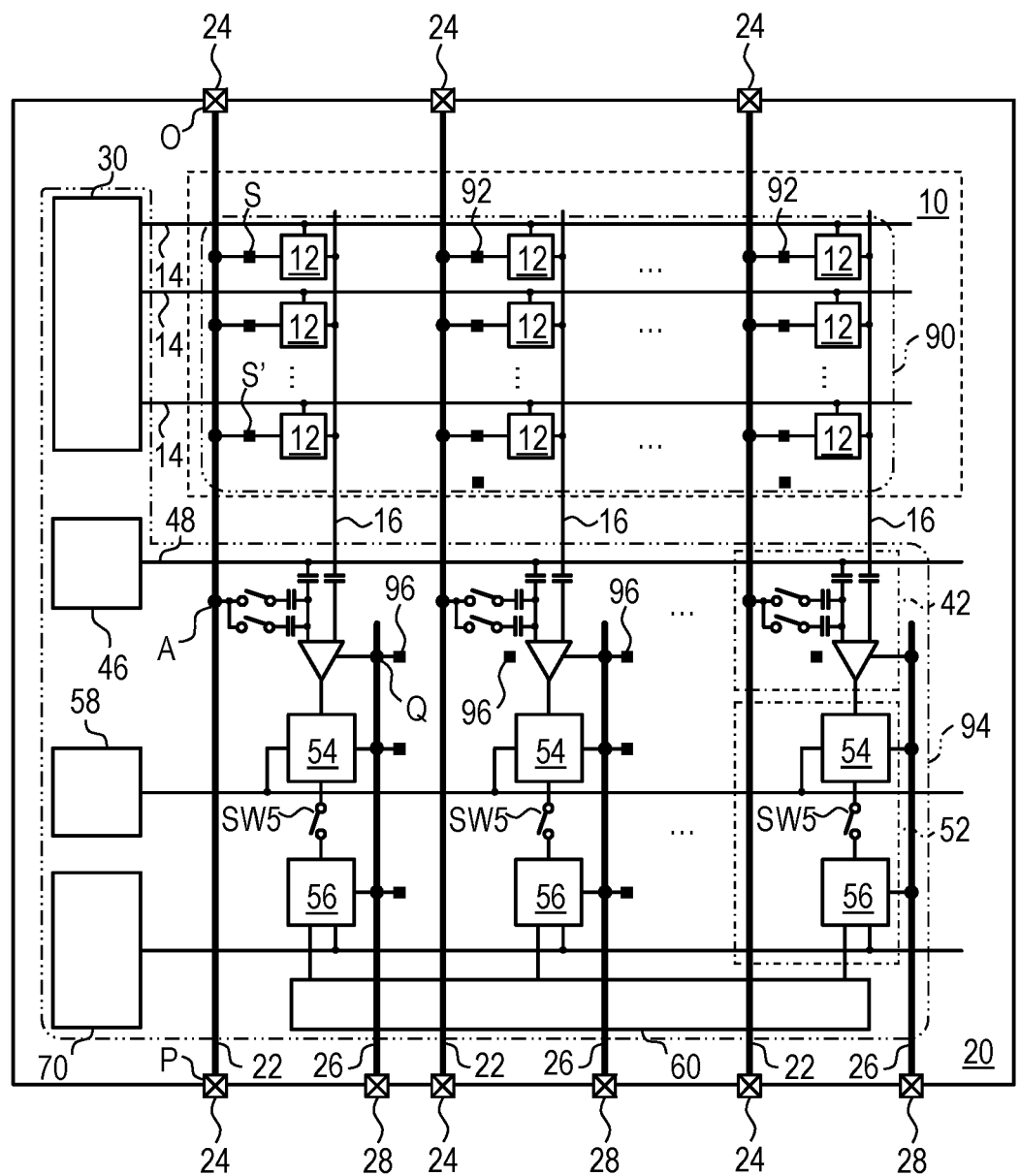
FIG. 5 is a schematic diagram illustrating an arrangement example of ground lines in the photoelectric conversion device according to the first embodiment of the present invention.
Figure 6:
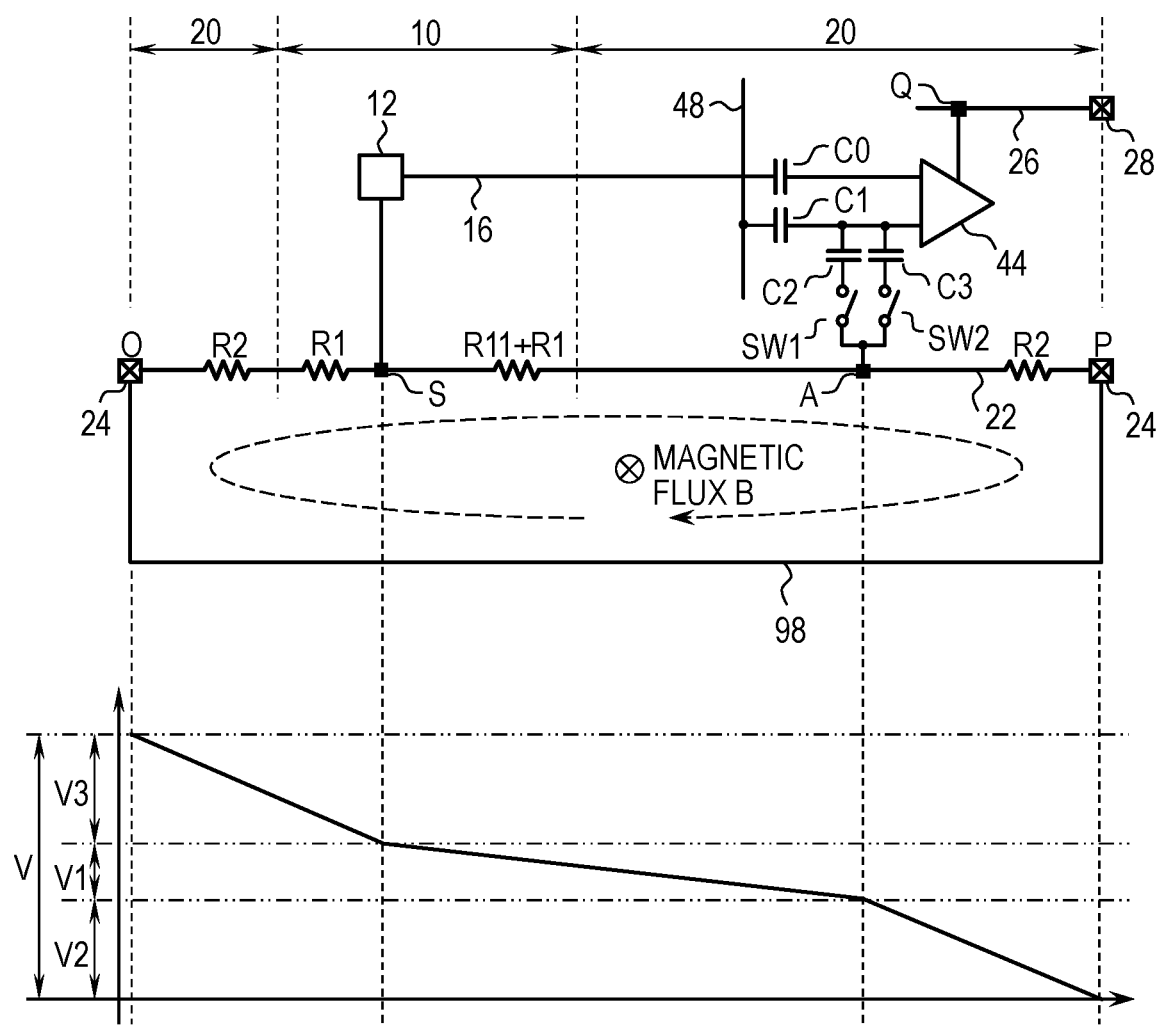
FIG. 6 is a diagram schematically illustrating an equivalent circuit of a ground loop in the photoelectric conversion device according to the first embodiment of the present invention.

FIG. 5 is a schematic diagram illustrating an arrangement example of ground lines in the pixel unit 10 and the peripheral circuit unit 20. FIG. 6 is a diagram schematically illustrating an equivalent circuit of a ground loop corresponding to one pixel column.

In the pixel unit 10, a pixel well region 90 (for example, a P-well) to which the ground potential is supplied and pixel ground lines 22 by which the ground potential is supplied to the pixel well region 90 are arranged. The pixel well region 90 is a semiconductor region provided in the semiconductor substrate. The pixel ground lines 22 are arranged so as to overlap the pixel well region 90 in a plan view to the semiconductor substrate. In other words, the pixel ground lines 22 are arranged above the pixel well region 90. Note that the plan view as used herein corresponds to a projection view vertically projected on a projection plane parallel to the face of the semiconductor substrate. The pixel well region 90 may be formed of a plurality of separately provided well regions. The pixel well region 90 and the pixel ground lines 22 are electrically connected via the pixel well contacts 92. The pixel ground lines 22 are connected to external ground terminals 24. The external ground terminals 24 are connected to a ground potential outside the photoelectric conversion device 100.

In the peripheral circuit unit 20, a peripheral well region 94 (for example, a P-well) to which the ground potential is supplied and peripheral ground lines 26 by which the ground potential is supplied to the peripheral well region 94 are arranged. The peripheral well region 94 is a semiconductor region provided in the semiconductor substrate. The peripheral ground lines 26 are arranged so as to overlap the peripheral well region 94 in the plan view to the semiconductor substrate. In other words, the peripheral ground lines 26 are arranged above the peripheral well region 94. The peripheral well region 94 may be formed of a plurality of separately provided well regions or may include wells having different conductivity types. The peripheral well region 94 and the peripheral ground lines 26 are electrically connected via the peripheral well contacts 96. The peripheral ground lines 26 are connected to external ground terminals 28. The external ground terminals 28 are connected to an external ground potential outside the photoelectric conversion device 100. The pixel well contacts 92 and the peripheral well contacts 96 may be arranged in any part and are not necessarily required to be aligned regularly.

The pixel ground lines 22 and the peripheral ground lines 26 are provided to extend in a direction (second direction) along columns of the pixel array of the pixel unit 10, for example, as illustrated in FIG. 5. Although one pixel ground line 22 and one peripheral ground line 26 are arranged for each column in FIG. 5, one pixel ground line 22 and one peripheral ground line 26 may be arranged for each multiple-column. The external ground terminal 24 is provided at each of both ends of the pixel ground lines 22. The external ground terminal 28 is provided at each one end of the peripheral ground lines 26.

Note that FIG. 5 illustrates the example in which the storage unit 52 on each column is formed of a writing memory 54, an inter-memory transfer switch SW5, and a readout memory 56. The writing memory 54 is connected to the comparator 44 of the comparator unit 42 and the counter circuit 58. The readout memory 56 is connected to the writing memory 54 via the inter-memory transfer switch SW5. The horizontal scanning circuit 60 is connected to the readout memory 56. The operation example when the storage unit 52 is configured as above will be described in a second embodiment.

For the purpose of illustration herein, a point A, a point O, a point P, a point Q, a point S, and a point S' are defined as follows in FIG. 5 and FIG. 6.

In the peripheral circuit unit 20, the electrode on the ground side of the capacitor C2 forming the comparator unit 42 is connected to the pixel ground line 22 via the switch SW1. Further, the electrode on the ground side of the capacitor C3 is connected to the pixel ground line 22 via the switch SW2. The points at which the capacitors C2 and C3 are connected to the pixel ground line 22 via the switches SW1 and SW2 are regarded as one node herein and defined as the point A. Herein, the pixel ground line 22 is provided so as to extend above the peripheral well region 94, and the point A is located in a region overlapping the peripheral well region 94 in the plan view.

Further, the ground terminal of the comparator 44 forming the comparator unit 42 is connected to the peripheral ground line 26. The point at which the ground terminal of the comparator 44 is connected to the peripheral ground line 26 is defined as the point Q.

In the pixel unit 10, out of the pixels 12 arranged on the same column as the comparator unit 42 to be focused on, the pixel well contact 92 connected to the ground terminal of the pixel 12 located at the farthest position from the comparator unit 42 is defined as the point S. Further, out of the pixels 12 arranged on the same column as the comparator unit 42 to be focused on, the pixel well contact 92 connected to the ground terminal of the pixel 12 located at the closest position to the comparator unit 42 is defined as the point S'.

Out of the external ground terminals 24, the external ground terminal 24 arranged at the closest position to the point A is defined as the point P. Further, the external ground terminal 24 whose connection node is located between the point A and the point S is defined as the point O.

Next, the electrical resistance between respective points in the equivalent circuit of the ground loop illustrated in FIG. 6 will be described with reference to FIG. 5 and FIG. 6.

When the electrical resistance between the point A and the point S' is R1 and the electrical resistance between the point S' and the point S is R11, the electrical resistance between the point A and the point S is R11+R1. Since a section between the point S and the point O is equivalent to a section between the point S' and the point P as a circuit, when the electrical resistance between the point A and the point P is R2, the electrical resistance between the point S and the point O is R1+R2.

Note that, since the electrical resistance on the pixel ground line 22 is uniform within a plane, the electrical resistance of the pixel ground line 22 is proportional to the length of the interconnection in general. Therefore, the electrical resistances R11 and R1 have a relationship of R11>R1. Further, although the electrical resistance R1 includes the on-resistances of MOS transistors forming the switches SW1 and SW2 in the actual implementation, these on-resistances are sufficiently small compared to the electrical resistances R1 and R11 and thus can be ignored on the equivalent circuit.

The external ground terminal 24 at the point O and the external ground terminal 24 at the point P are electrically connected to each other via an interconnection 98 provided to a printed board on which the photoelectric conversion device 100 is implemented. That is, a ground loop is formed of the pixel ground line 22 and the interconnection 98, and the respective points described above are arranged on this ground loop in the order of the point A, the point S, the point O, the point P, and the point A.

In a field where a magnetic field is present, the induced electromotive force V in accordance with a temporal change of the magnetic flux B occurs in the ground loop when the magnetic flux B penetrates the ground loop. This follows Faraday's law, and the relationship between the occurring induced electromotive force V and the change ΔB of the magnetic flux B for micro time Δt is expressed by Equation (4).

$$V = -\Delta B / \Delta t \quad (4)$$

If the induced electromotive force V causes a voltage distribution to occur within the ground loop that is supposed to have the same potential, signals of the pixel unit 10 will differ due to the distribution of the ground potential, which appears as pattern noise (magnetic noise) in the output image of the photoelectric conversion device.

The lower stage of FIG. 6 illustrates an induced voltage difference V1 between the point A and the point S, an induced voltage difference V2 between the point A and the point P, and an induced voltage difference V3 between the point S and the point O in the induced electromotive force V occurring in the ground loop. The induced voltage differences V1, V2, and V3 are voltages divided from the induced electromotive force V by the electrical resistances of respective sections and thus can be expressed as Equation (5), Equation (6), and Equation (7) below.

$$V1 = V \times (R11+R1)/(R11+2\times R1+2\times R2) \quad (5)$$

$$V2 = V \times R2/(R11+2\times R1+2\times R2) \quad (6)$$

$$V3 = V \times (R2+R1)/(R11+2\times R1+2\times R2) \quad (7)$$

Herein, the signal from the pixel unit 10 input to the first input terminal of the comparator 44 includes, as magnetic noise, the induced voltage difference (V1+V2) at the point S to which the ground terminal of the pixel unit 10 is connected. On the other hand, the reference signal input to the second input terminal of the comparator 44 includes the induced voltage difference V2 at the point A as magnetic noise. Therefore, the magnetic noise output Vout of the comparator 44 is the induced voltage difference V1 between the point A and the point S from which the induced voltage difference V2 between the point A and the point P is removed, as expressed by Equation (8) below.

$$Vout = (V1+V2) - (V2) = V1 \quad (8)$$

That is, the photoelectric conversion device of the present embodiment can reduce magnetic noise occurring in the pixel ground line 22, because the ground electrodes of the capacitors C2 and C3 forming the comparator unit 42 are connected to the pixel ground line 22 via the switches SW1 and SW2.

As described above, according to the present embodiment, it is possible to reduce influence of magnetic noise superimposed on a ground line while suppressing horizontal stripe noise due to a reference signal generation circuit.

Second Embodiment

A photoelectric conversion device and a method of driving the same according to a second embodiment of the present invention will be described with reference to FIG. 7 to FIG. 9. The same components as those in the photoelectric conversion device according to the first embodiment are labeled with the same references, and the description thereof will be omitted or simplified.

Figure 7:
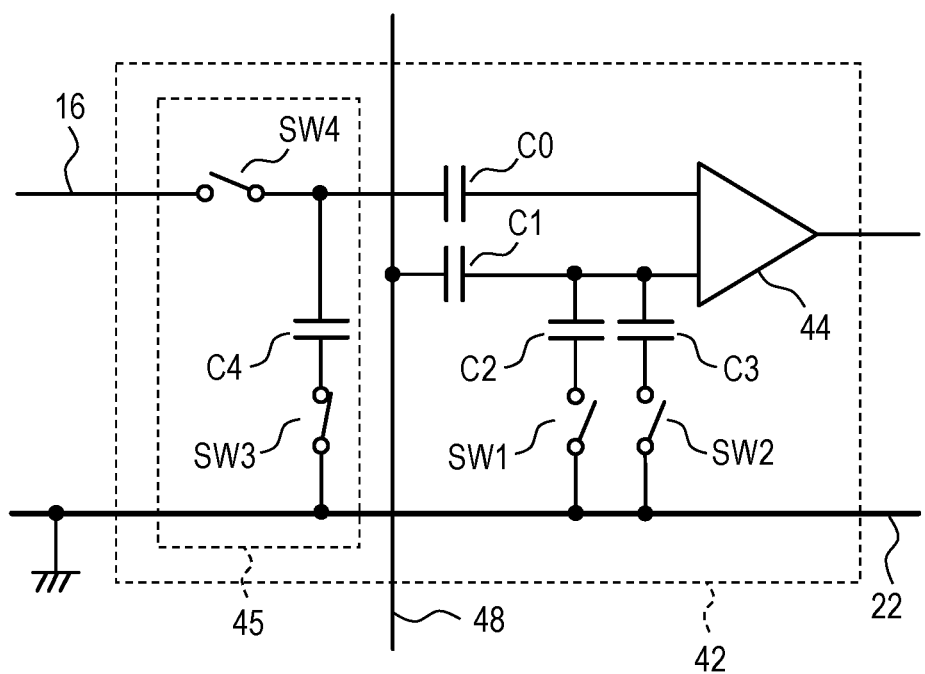
FIG. 7 is a circuit diagram illustrating a configuration example of a comparator unit in a photoelectric conversion device according to a second embodiment of the present invention.

FIG. 7 is a circuit diagram illustrating a configuration example of the comparator unit in the photoelectric conversion device according to the present embodiment. FIG. 8 is a diagram schematically illustrating an equivalent circuit of the ground loop corresponding to one pixel column. FIG. 9 is a timing chart illustrating the operation of the photoelectric conversion device according to the present embodiment.

The photoelectric conversion device according to the present embodiment has the same overall configuration as the photoelectric conversion device according to the first embodiment except for the configuration of the comparator unit 42 on each column forming the comparator circuit 40.

Figure 8:
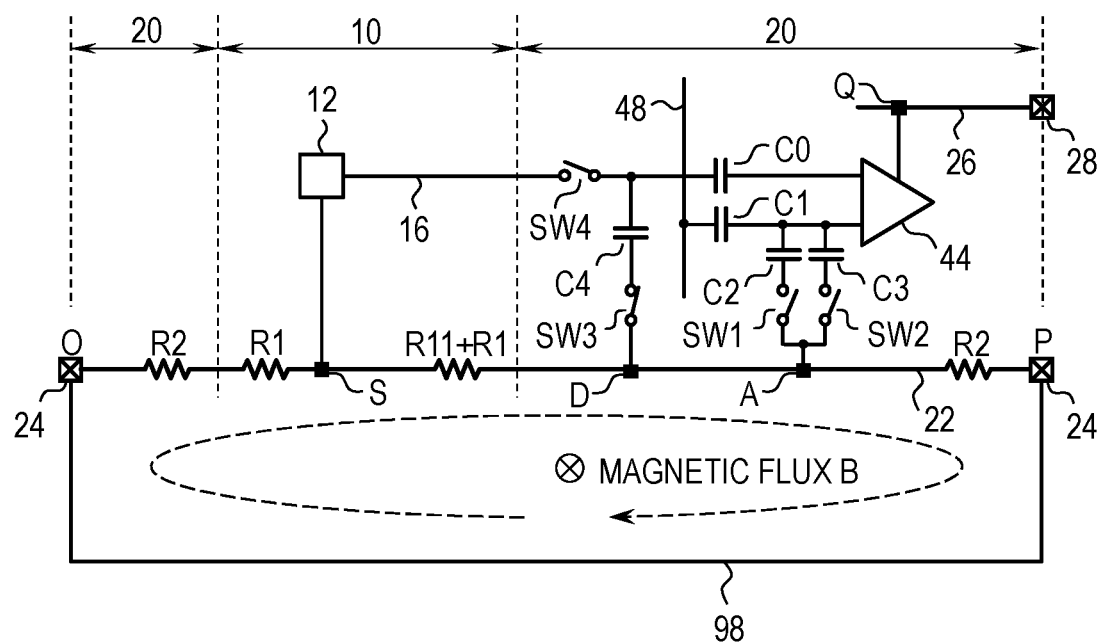
FIG. 8 is a diagram schematically illustrating an equivalent circuit of a ground loop in the photoelectric conversion device according to the second embodiment of the present invention.

As illustrated in FIG. 7 and FIG. 8, the comparator unit 42 in the photoelectric conversion device of the present embodiment further includes a sample-hold unit 45 connected between the output line 16 and the capacitor C0. The sample-hold unit 45 includes switches SW3 and SW4 and a capacitor C4. The switch SW4 is connected between the output line 16 and the capacitor C0. One electrode (signal electrode) of the capacitor C4 is connected to the connection node between the switch SW4 and the capacitor C0. The other electrode (ground electrode) of the capacitor C4 is connected to the pixel ground line 22 via the switch SW3. The point at which the capacitor C4 is connected to the pixel ground line 22 via the switch SW3 is defined as a point D. Note that, since the point D is arranged near the point A, the electrical resistance between the point A and the point D is sufficiently small and can be ignored on the equivalent circuit.

When the switch SW3 is turned on and the switch SW4 is turned off from the on-state with a pixel signal being output from the pixel 12 to the output line 16, the pixel signal appearing on the output line 16 is held in the capacitor C4. Thereby, since the capacitor C4 can be in a state of being electrically disconnected from the output line 16, an operation of reading out an analog signal from a pixel and an AD conversion operation can be performed in parallel. This enables fast readout.

Note that the switch SW3 is always in the on-state (conductive state) in the present embodiment. However, in a case of an operation method in which the switch SW4 is always in the on-state (conductive state) and an operation of reading out an analog signal from a pixel and an AD conversion operation are not performed in parallel, the switch SW3 may be in the off-state (nonconductive state). With such a configuration, it is possible to cause the capacitor C4 not to serve as a load and shorten a period in which the pixel signal appears on the output line 16 (stabilization period).

Next, the operation of the photoelectric conversion device according to the present embodiment will be described with reference to FIG. 7 to FIG. 9. Herein, the operation of a pixel belonging to the n-th row (n is an integer greater than or equal to one) and a pixel belonging to the (n+1)-th row in the pixel array forming the pixel unit 10 will be described. Further, the storage unit 52 will be described with reference to the configuration illustrated in FIG. 5 including the writing memory 54, the inter-memory transfer switch SW5, and the readout memory 56.

Figure 9:
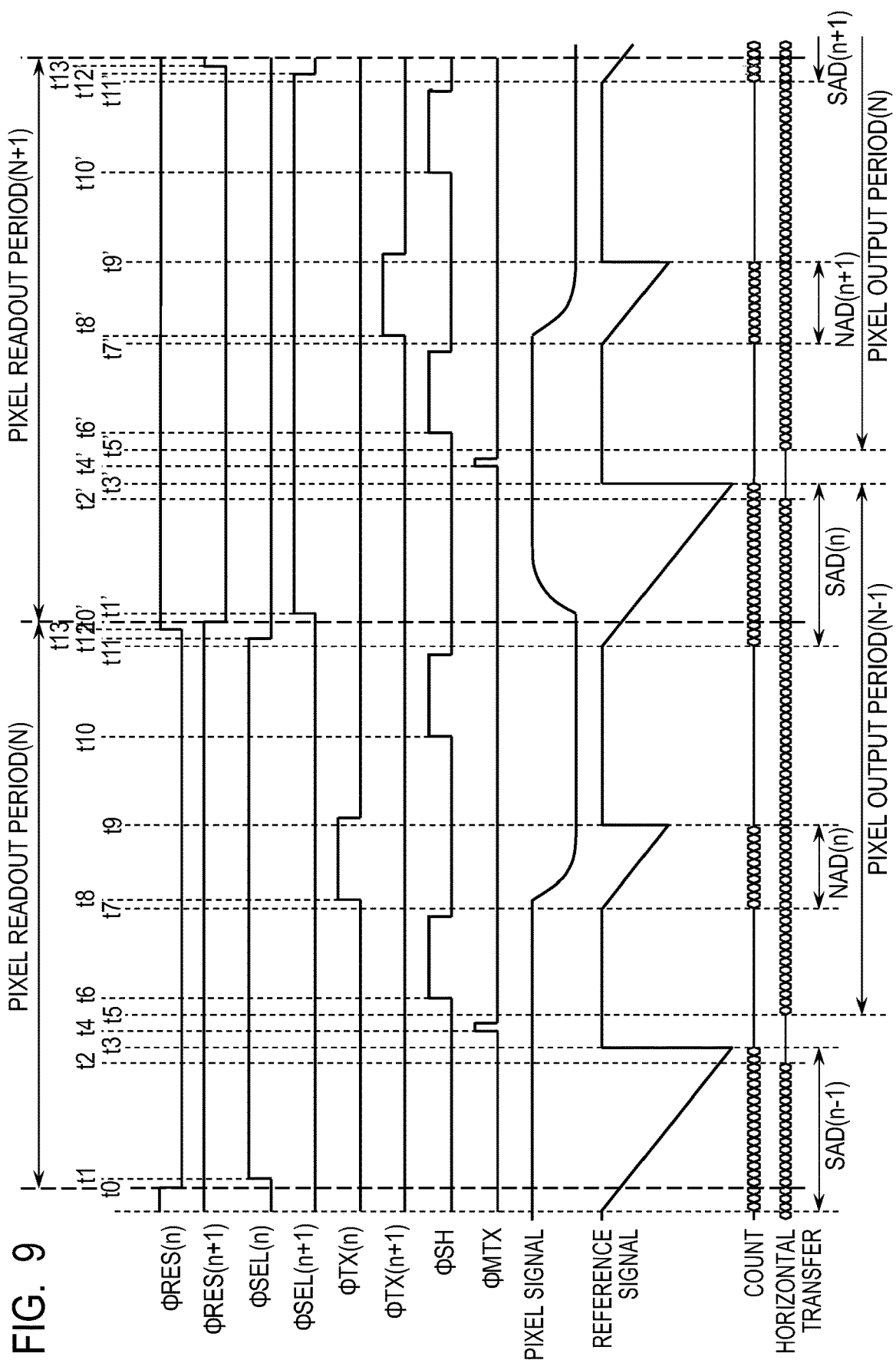
FIG. 9 is a timing chart illustrating the operation of the photoelectric conversion device according to the second embodiment of the present invention.

In FIG. 9, control signals ΦRES(n), ΦSEL(n), and ΦTX(n) are control signals supplied to the reset transistor M2, the select transistor M4, and the transfer transistor M1 of the pixel 12 belonging to the n-th row. Control signals ΦRES(n+1), ΦSEL(n+1), and ΦTX(n+1) are control signals supplied to the reset transistor M2, the select transistor M4, and the transfer transistor M1 of the pixel 12 belonging to the (n+1)-th row. The control signals ΦRES, ΦSEL, and ΦTX are supplied from the vertical scanning circuit 30 to the pixels 12 on respective rows on a row basis under the control of the control circuit 80.

Further, a control signal ΦSH is a control signal supplied from the control circuit 80 to the control node of the switch SW4 of the sample-hold unit 45. It is assumed here that the switch SW4 is in the on-state (conductive state) when the control signal ΦSH is at the high level, and the switch SW4 is in the off-state (nonconductive state) when the control signal ΦSH is at the low level. In the present embodiment, the switch SW3 is always in the on-state (conductive state). A control signal ΦMTX is a control signal supplied from the control circuit 80 to the control node of the inter-memory transfer switch SW5. It is assumed here that the inter-memory transfer switch SW5 is in the on-state (conductive state) when the control signal ΦMTX is at the high level, and the inter-memory transfer switch SW5 is in the off-state (nonconductive state) when the control signal ΦMTX is at the low level.

In the present embodiment, an operation example of performing, in parallel, at least two of a sample-hold operation of an analog pixel signal output from the pixel 12, an AD conversion operation, and a signal output operation from the readout memory 56 will be described.

The period from time t0 to time t0' is a period up to when an analog pixel signal is held in the capacitor C4 from the pixel 12 on the n-th row (pixel readout period (n)).

At time t0, the control signal ΦRES(n) is controlled from the high level to the low level, and the reset transistor M2 of the pixel 12 on the n-th row is turned off. Thereby, the reset state of the floating diffusion portion FD, that is, the gate node of the amplifier transistor M3 of the pixel 12 on the n-th row is cancelled.

At subsequent time t1, the control signal ΦSEL(n) is controlled from the low level to the high level, and the select transistor M4 of the pixel 12 on the n-th row is turned on. Thereby, the pixel 12 on the n-th row is selected, and a signal corresponding to the fact that the gate node of the amplifier transistor M3 of the pixel 12 on the n-th row has been reset appears on the output line 16 on each column. This output signal includes noise occurring when the reset transistor M2 is turned off and noise due to the amplifier transistor M3. Hereafter, this output signal is referred to as "N-signal".

The period before time t2 is a period in which an operation to transfer, from the readout memory 56 to the signal processing circuit 70, a digital signal obtained by performing AD conversion on the N-signal of the pixel 12 on the (n−1)-th row, that is, a horizontal transfer operation is performed. Note that, although an example in which the horizontal transfer operation is started before time t0 is illustrated in FIG. 9, the horizontal transfer operation may be started on or after time t0 for some conditions such as the number of readout memories 56 or the operating frequency of the horizontal scanning circuit 60.

Further, the period before time t3 is a period in which an analog pixel signal of the pixel 12 on the (n−1)-th row held in the capacitor C4 is converted into a digital signal (period SAD(n−1)). During this period, the control signal ΦSH is at the low level, and the capacitor C4 is electrically disconnected from the output line 16 by the switch SW4. The comparator unit 42 compares the signal level of the temporally changing reference signal with the signal level of the pixel signal and, when the relationship of these signals is inverted, causes the output signal to transition from the high level to the low level or otherwise from the low level to the high level. The storage unit 52 holds the count value represented by the count signal that is being received from the counter circuit 58 at this time in the writing memory 54 by using the transition of the output signal of the comparator unit 42 as a latch signal. Note that, although FIG. 9 illustrates the example in which the period SAD(n−1) is started before time t0, the period SAD(n−1) may be started on or after time t0 for some conditions such as the resolution of AD conversion or the operating frequency.

At subsequent time t4, the control signal ΦMTX is controlled from the low level to the high level, two digital signals held in the writing memory 54 of the storage unit 52 on each column in the period NAD(n−1) and the period SAD(n−1) are transferred to the readout memory 56. Note that the period NAD(n−1) is a period occurring before the period SAD(n−1) in which a pixel signal (N-signal) of the pixel 12 on the (n−1)-th row is converted into a digital signal.

The subsequent period from time t5 to time t2' is a period in which a horizontal transfer operation to transfer a digital signal obtained by AD conversion in the period SAD(n−1) from the readout memory 56 of the storage unit 52 on each column to the signal processing circuit 70 is performed.

In the period from time t6 before time t7, the control signal ΦSH is temporarily controlled from the low level to the high level, and the switch SW4 is turned on. Thereby, the output line 16 and the capacitor C4 are connected via the switch SW4, and the N-signal of the pixel 12 on the n-th row that is being output to the output line 16 is held in the capacitor C4.

The subsequent period from time t7 to time t9 is a period in which the N-signal of the pixel 12 on the n-th row held in the capacitor C4 is converted into a digital signal (period NAD(n)). During the period NAD(n), since the control signal ΦSH is at the low level, the capacitor C4 is in a state of being electrically disconnected from the output line 16.

In a predetermined period from time t8, the control signal ΦTX(n) is temporarily controlled to the high level, and the transfer transistor M1 of the pixel 12 on the n-th row is turned on. Thereby, charges accumulated in the photoelectric converter PD of the pixel 12 on the n-th row are transferred to the floating diffusion portion FD, and the potential of the gate node of the amplifier transistor M3 becomes a potential in accordance with the amount of charges transferred from the photoelectric converter PD. The potential of the output line 16 changes in accordance with the change of the potential of the gate node of the amplifier transistor M3. A pixel signal being output to the output line 16 at this time corresponds to the sum of the signal in accordance with the amount of charges generated by the photoelectric converter PD and the N-signal output from the pixel at time t1. Hereafter, such an output signal is referred to as "(S+N)-signal".

In the subsequent period from time t10 before time t11, the control signal ΦSH is temporarily controlled from the low level to the high level, and the switch SW4 is turned on. Thereby, the output line 16 and the capacitor C4 are connected via the switch SW4, and the (S+N)-signal of the pixel 12 on the n-th row that is being output to the output line 16 is held in the capacitor C4.

The subsequent period from time t11 to time t3' is a period in which the (S+N)-signal of the pixel 12 on the n-th row held in the capacitor C4 is converted into a digital signal (period SAD(n)). In this period, the control signal ΦSH is at the low level, and the capacitor C4 is electrically disconnected from the output line 16 by the switch SW4. The comparator unit 42 compares the signal level of the temporally changing reference signal with the signal level of the (S+N)-signal and, when the relationship of these signals is inverted, causes the output signal to transition from the high level to the low level or otherwise from the low level to the high level. The storage unit 52 holds the count value represented by the count signal that is being received from the counter circuit 58 at this time in the writing memory 54 by using the transition of the output signal of the comparator unit 42 as a latch signal.

At subsequent time t12, the control signal ΦSEL(n) is controlled from the high level to the low level, and the select transistor M4 of the pixel 12 on the n-th row is turned off. Thereby, the selection of the pixel 12 on the n-th row is cancelled.

At subsequent time t13, the control signal ΦRES(n) is controlled from the low level to the high level, and the reset transistor M2 of the pixel 12 on the n-th row is turned on. Thereby, the floating diffusion portion FD, that is, the gate node of the amplifier transistor M3 of the pixel 12 on the n-th row is in a reset state.

Since the operation of the pixel readout period (n+1) starting from subsequent time t0' is the same as the operation of the pixel readout period (n) from time t0 to time t13, the description thereof will be omitted here.

Two digital signals on each column obtained in the period NAD(n) and the period SAD(n) are horizontally transferred to the signal processing circuit 70 in the signal output period (n) after time t5'. In the signal processing circuit 70, a differential process of digital data is performed on two digital signals on each column, and characteristic variation of the comparator units 42 is removed.

As described above, in the present embodiment, the capacitor C4 is electrically disconnected from the output line 16 in an AD conversion period while holding a pixel signal. The signal held in the capacitor C4 is then provided to the first input terminal of the comparator 44 via the capacitor C0. Since the capacitor C4 is electrically disconnected from the output line 16, transfer of charges accumulated in the photoelectric converter PD to the floating diffusion portion FD or output of a signal in accordance with the amount of transferred charges to the output line 16 can be performed at the same time. That is, in the present embodiment, in a period in which an analog signal is read out from a pixel on a certain row, an AD conversion operation and a horizontal transfer operation can be performed in parallel, and fast readout can be realized.

Further, in the present embodiment, the ground line to which the capacitor C4 is connected at the point D via the switch SW3 is the pixel ground line 22. If the point D is a connection node to the peripheral ground line 26, a transient change due to influence of the control signal ΦTX or the like occurring when a pixel signal is read out from the pixel 12 appears only at the second input terminal of the comparator 44 via the switches SW1 and SW2 and the capacitors C2 and C3. As a result, such a change appears as noise also in the output of the comparator 44.

In this regard, since the point D is connected to the pixel ground line 22 in the present embodiment, a transient change due to influence of the control signal ΦTX or the like appears at two input terminals of the comparator 44 as in-phase signals via the capacitors C4 and C0 and the capacitors C2 and C3. These in-phase signals are removed by the comparator 44. That is, the ground electrode of the capacitor C4 and the ground electrodes of the capacitors C2 and C3 are connected to the common pixel ground line 22, and thereby influence on an AD conversion operation caused by a transient change (noise) occurring when an analog signal is read out can be suppressed.

As described above, according to the present embodiment, it is possible to suppress a transient change (noise) due to fast readout in addition to influence of horizontal stripe noise and magnetic noise.

Third Embodiment

Figure 10:
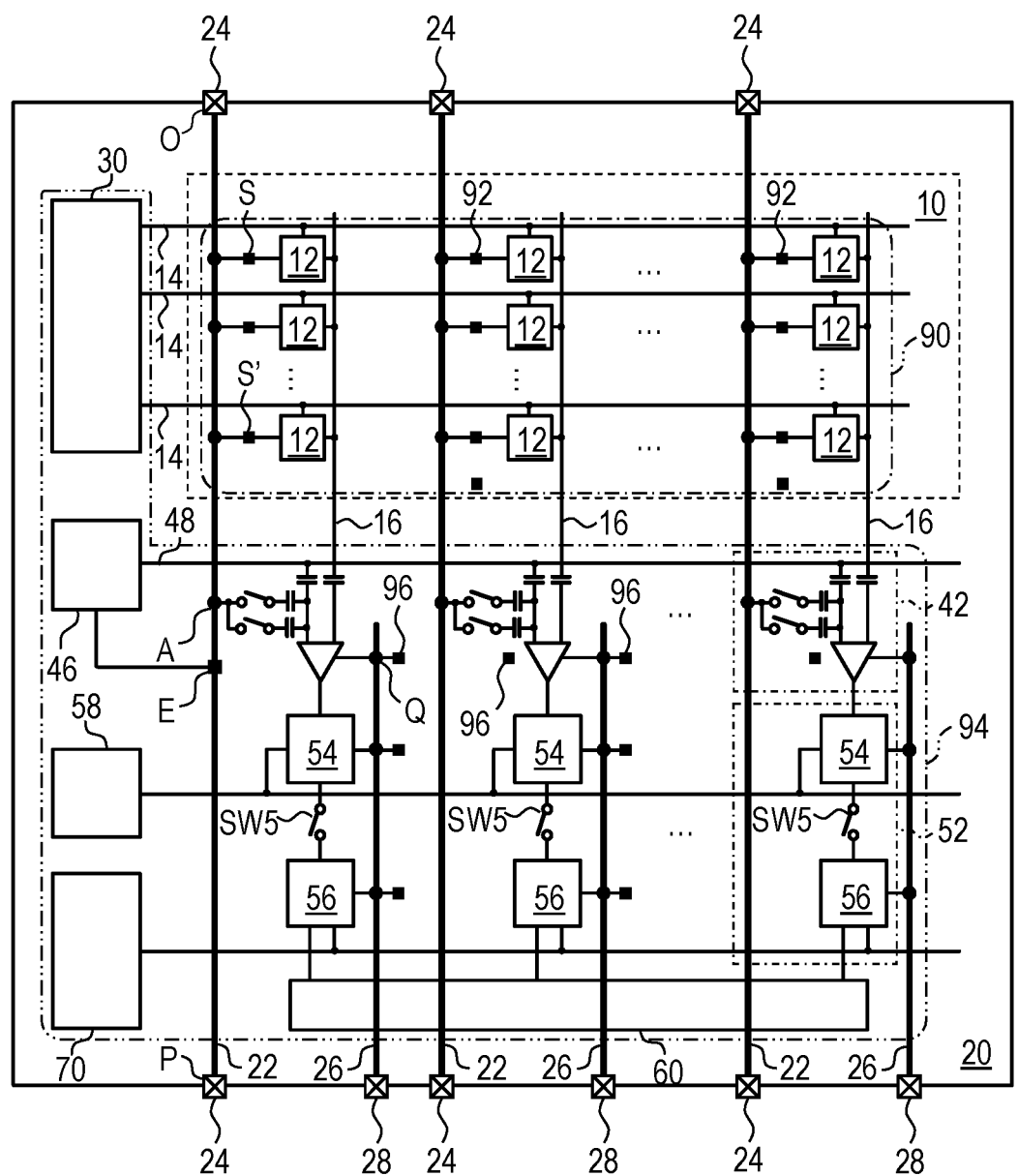
FIG. 10 is a schematic diagram illustrating an arrangement example of ground lines in a photoelectric conversion device according to a third embodiment of the present invention.

A photoelectric conversion device and a method of driving the same according to a third embodiment of the present invention will be described with reference to FIG. 10. The same components as those in the photoelectric conversion device according to the first and second embodiments are labeled with the same references, and the description thereof will be omitted or simplified. FIG. 10 is a schematic diagram illustrating a configuration example of the ground lines in the photoelectric conversion device according to the present embodiment.

The photoelectric conversion device according to the present embodiment has the same overall configuration as the photoelectric conversion device according to the first embodiment except for the configuration of the reference signal generation circuit 46. That is, in the photoelectric conversion device according to the present embodiment, the ground terminal of the reference signal generation circuit 46 is connected to the pixel ground line 22. Herein, the point at which the ground terminal of the reference signal generation circuit 46 is connected to the pixel ground line 22 is defined as a point E. The point E is located in a region overlapping the peripheral well region 94 in the plan view.

In the present embodiment, since the ground terminal of the reference signal generation circuit 46 is also connected to the pixel ground line 22, magnetic noise occurring on the pixel ground line 22 appears at the second input terminal of the comparator 44 via the capacitor C1. Further, since the pixel unit 10 is also connected to the pixel ground line 22, magnetic noise occurring on the pixel ground line 22 appears at the first input terminal of the comparator 44 via the capacitor C0. These in-phase signals are removed by the comparator 44.

Therefore, with the ground terminal of the reference signal generation circuit 46 being also connected to the pixel ground line 22, influence of magnetic noise can be further suppressed.

As described above, according to the present embodiment, it is possible to more effectively reduce influence of magnetic noise superimposed on a ground line while suppressing horizontal stripe noise due to a reference signal generation circuit.

Fourth Embodiment

Figure 11:
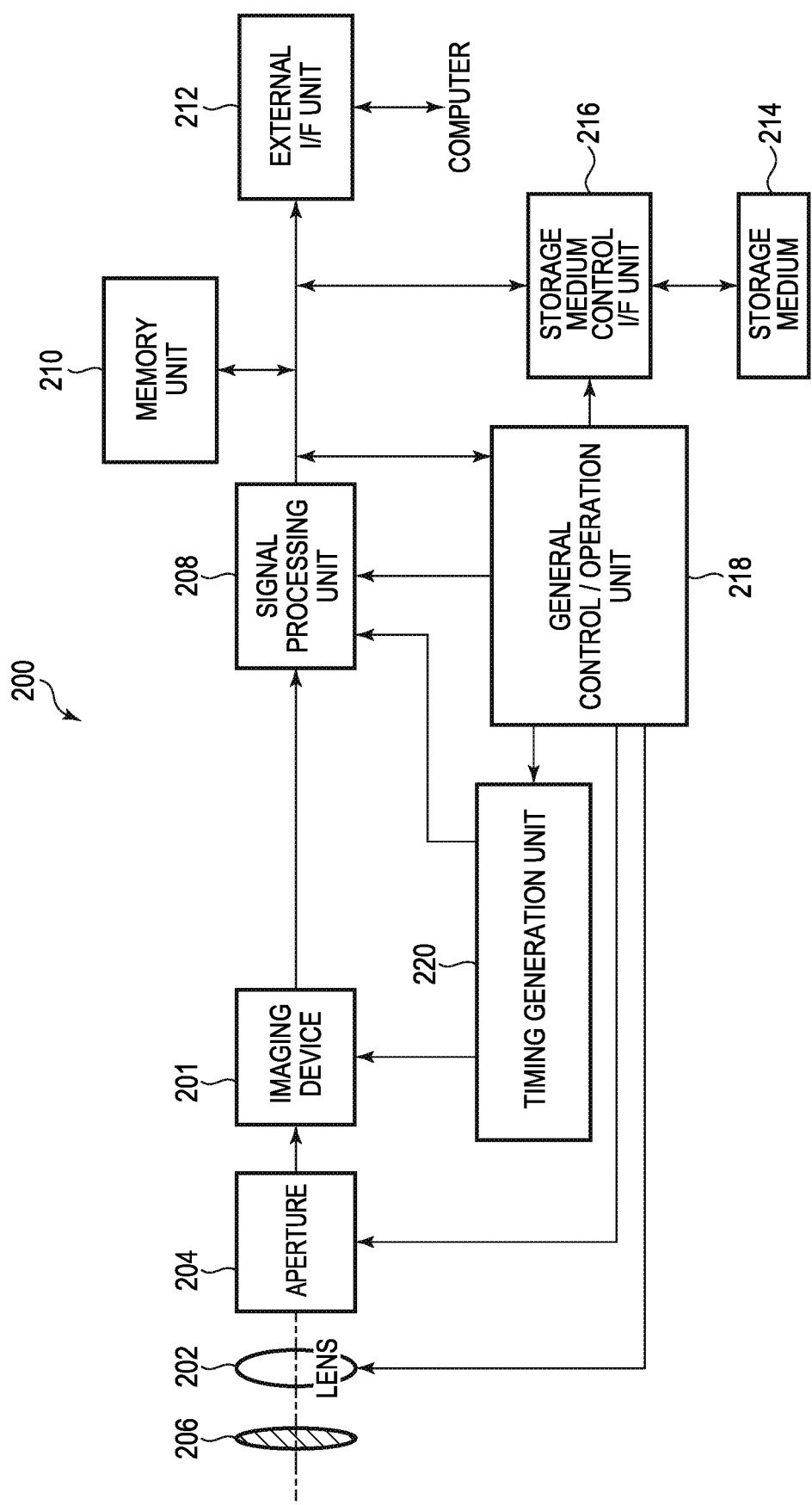
FIG. 11 is a block diagram illustrating a general configuration of an imaging system according to a fourth embodiment of the present invention.

An imaging system according to a fourth embodiment of the present invention will be described with reference to FIG. 11. FIG. 11 is a block diagram illustrating a general configuration of the imaging system according to the present embodiment.

The photoelectric conversion device 100 described in the first to third embodiments described above can be applied to various imaging systems. Examples of applicable imaging systems may include a digital still camera, a digital camcorder, a surveillance camera, a copying machine, a fax machine, a mobile phone, an on-vehicle camera, an observation satellite, and the like. In addition, a camera module including an optical system such as a lens and an imaging device is also included in the imaging system. FIG. 11 illustrates a block diagram of a digital still camera as an example out of these examples.

An imaging system 200 illustrated as an example in FIG. 11 includes an imaging device 201, a lens 202 that captures an optical image of an object onto the imaging device 201, an aperture 204 for changing a light amount passing through the lens 202, and a barrier 206 for protecting the lens 202. The lens 202 and the aperture 204 form an optical system that converges a light onto the imaging device 201. The imaging device 201 is the photoelectric conversion device 100 described in any of the first to third embodiments and converts an optical image captured by the lens 202 into image data.

Further, the imaging system 200 includes a signal processing unit 208 that processes an output signal output from the imaging device 201. The signal processing unit 208 performs AD conversion to convert an analog signal output from the imaging device 201 into a digital signal. In addition, the signal processing unit 208 performs operations of performing various correction or compression to output image data, if necessary. The AD conversion unit that is a part of the signal processing unit 208 may be formed on a semiconductor substrate on which the imaging device 201 is provided or formed on a semiconductor substrate separately from the imaging device 201. Further, the imaging device 201 and the signal processing unit 208 may be formed on the same semiconductor substrate.

Furthermore, the imaging system 200 includes a memory unit 210 for temporarily storing image data therein and an external interface unit (external I/F unit) 212 for communicating with an external computer or the like. The imaging system 200 further includes a storage medium 214 such as a semiconductor memory for performing storage or readout of imaging data and a storage medium control interface unit (storage medium control I/F unit) 216 for performing storage or readout on the storage medium 214. Note that the storage medium 214 may be embedded in the imaging system 200 or may be removable.

Furthermore, the imaging system 200 includes a general control/operation unit 218 that performs various calculation and controls the entire digital still camera and a timing generation unit 220 that outputs various timing signals to the imaging device 201 and the signal processing unit 208. Here, the timing signal or the like may be input from the outside, and the imaging system 200 may include at least the imaging device 201 and the signal processing unit 208 that processes an output signal output from the imaging device 201.

The imaging device 201 outputs an imaging signal to the signal processing unit 208. The signal processing unit 208 performs predetermined signal processing on an imaging signal output from the imaging device 201 and outputs image data. The signal processing unit 208 uses an imaging signal to generate an image.

As described above, according to the present embodiment, the imaging system to which the photoelectric conversion device 100 according to the first to third embodiment is applied can be realized.

Fifth Embodiment

Figure 12A:
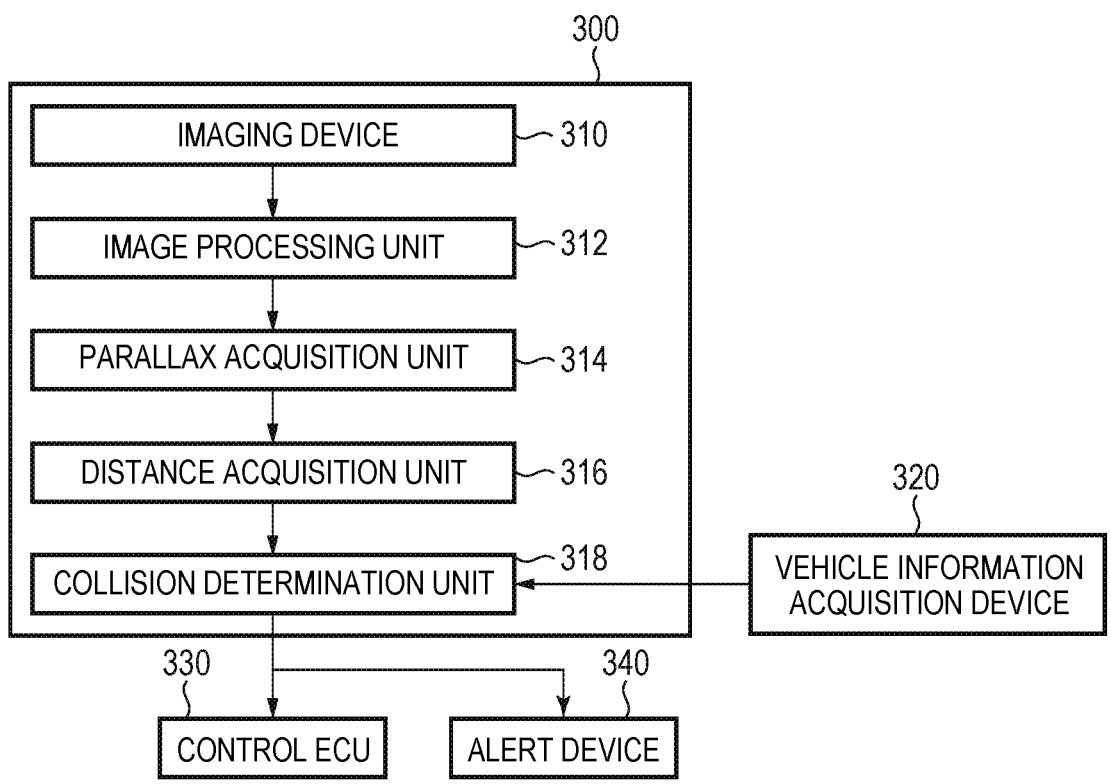
FIG. 12A is a diagram illustrating a configuration example of an imaging system according to a fifth embodiment of the present invention.
Figure 12B:
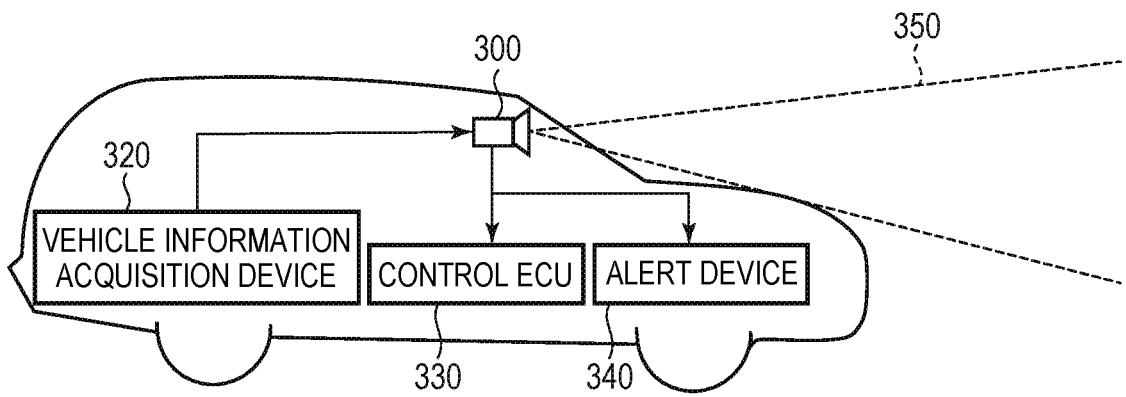
FIG. 12B is a diagram illustrating a configuration example of a movable object according to a fifth embodiment of the present invention.

An imaging system and a movable object according to a fifth embodiment of the present invention will be described with reference to FIG. 12A and FIG. 12B. FIG. 12A is a diagram illustrating a configuration of the imaging system according to the present embodiment. FIG. 12B is a diagram illustrating a configuration of the movable object according to the present embodiment.

FIG. 12A illustrates an example of an imaging system related to an on-vehicle camera. An imaging system 300 includes an imaging device 310. The imaging device 310 is the photoelectric conversion device 100 described in any of the above first to third embodiments. The imaging system 300 includes an image processing unit 312 that performs image processing on a plurality of image data acquired by the imaging device 310 and a parallax acquisition unit 314 that calculates a parallax (a phase difference of parallax images) from the plurality of image data acquired by the imaging system 300. Further, the imaging system 300 includes a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like or may be implemented by a combination thereof.

The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 12B illustrates the imaging system when a front area of a vehicle (a capturing area 350) is captured. The vehicle information acquisition device 320 transmits an instruction to the imaging system 300 or the imaging device 310. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is also one of the embodiments of the present invention.

Further, although two series-connected components each formed of a capacitor and a switch are connected in parallel between the other input terminal of the comparator 44 and the pixel ground line 22 in the above embodiments, the number of series-connected components connected in parallel is not necessarily limited to two. The number of series-connected components can be appropriately selected in accordance with the type of the AD conversion gain that can be set, for example, and may be one or may be three or greater.

Further, although influence of noise input to the comparator 44 forming the AD converter circuit has been described in the above embodiments, such influence of noise may similarly occur in a photoelectric conversion device having a differential amplifier circuit in the readout circuit unit. Therefore, the configuration of the present invention can be applied to the photoelectric conversion device configured to amplify a pixel signal by using a differential amplifier circuit, for example.

Further, the photoelectric conversion device illustrated in the above first to third embodiments may be used as a device intended to acquire an image, that is, a solid state imaging device. However, application examples of the photoelectric conversion device described in the present specification are not necessarily limited to a solid state imaging device. For example, in a case of application to a device intended to range as described in the above fourth embodiment, an image is not necessarily required to be output. In such a case, it can be said that the device is a photoelectric conversion device that converts optical information into a predetermined electrical signal. A solid state imaging device is one of the photoelectric conversion devices.

Further, the imaging systems illustrated in the above fourth and fifth embodiments are examples of an imaging system to which the photoelectric conversion device of the present invention may be applied, and an imaging system to which the photoelectric conversion device of the present invention can be applied is not limited to the configuration illustrated in FIG. 11 and FIG. 12A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-133490, filed Jul. 19, 2019 which is hereby incorporated by reference herein in its entirety.

What is claimed is:

1. A photoelectric conversion device comprising:
   a semiconductor substrate including a pixel well region well;
   a pixel ground line arranged above the pixel well region;
   a pixel well contact connected between the pixel ground line and the pixel well region;
   a plurality of pixels arranged to form a plurality of columns in the pixel well region and each configured to output a pixel signal in accordance with a light amount of incident light;
   a reference signal generation circuit configured to generate a reference signal having a predetermined amplitude; and
   a plurality of comparator units provided to corresponding ones of the plurality of columns, and each configured to receive the pixel signal from the pixels on a corresponding column and the reference signal,
   wherein each of the plurality of comparator units includes
      a comparator having a first input node that receives the pixel signal and a second input node that receives the reference signal,
      a first capacitor unit connected between the reference signal generation circuit and the second input node, and
      a second capacitor unit connected between the second input node and the pixel ground line.

2. The photoelectric conversion device according to claim 1 further comprising a peripheral well region included in the semiconductor substrate,
   wherein the pixel ground line extends above the peripheral well region and is connected to the second capacitor unit in a region overlapping the peripheral well region.

3. The photoelectric conversion device according to claim 1, wherein the second capacitor unit includes at least one series-connected component of a first capacitor element and a first switch.

4. The photoelectric conversion device according to claim 3, wherein the second capacitor unit includes a plurality of series-connected components of the first capacitor element and the first switch in parallel.

5. The photoelectric conversion device according to claim 3 further comprising a control circuit that switches an amplitude of the reference signal input to the second input node by controlling a connection state of the first switch.

6. The photoelectric conversion device according to claim 1 further comprising a plurality of output lines each arranged on corresponding ones of the plurality of columns, wherein the pixel signal from the pixels on a corresponding column is output to each of the plurality of output lines, wherein each of the plurality of comparator units further includes a third capacitor unit connected between each of the output lines on a corresponding column and the first input node.

7. The photoelectric conversion device according to claim 6, wherein each of the plurality of comparator units further includes a sample-hold unit provided between each of the output lines on the corresponding column and the third capacitor unit.

8. The photoelectric conversion device according to claim 7, wherein the sample-hold unit includes a second switch connected between the output lines on the corresponding column and the third capacitor unit and a fourth capacitor unit connected between the pixel ground line and a connection node between the second switch and the third capacitor unit.

9. The photoelectric conversion device according to claim 8, wherein the fourth capacitor unit includes a series-connected component between a second capacitor element and a third switch.

10. The photoelectric conversion device according to claim 1, wherein a ground terminal of the reference signal generation circuit is connected to the pixel ground line.

11. The photoelectric conversion device according to claim 1, wherein the pixel ground line extends in a direction along the plurality of columns.

12. The photoelectric conversion device according to claim 1, wherein the pixel ground line is provided to corresponding ones of the plurality of columns.

13. The photoelectric conversion device according to claim 1, wherein the reference signal is a ramp signal whose signal level changes with a lapse of time.

14. The photoelectric conversion device according to claim 1 further comprising:
a peripheral ground line arranged above a peripheral well region included in the semiconductor substrate; and
a pixel well contact connected between the peripheral ground line and the peripheral well region.

15. The photoelectric conversion device according to claim 1 further comprising:
a counter circuit that starts a count operation in synchronization with output of the reference signal from the reference signal generation circuit; and
a storage unit provided to each of the plurality of columns and configured to store, as digital data of the pixel signal, a count value indicated by a count signal output from the counter circuit in accordance with a result of comparison between the pixel signal and the reference signal performed by the comparator unit.

16. A photoelectric conversion device comprising:
a semiconductor substrate including a pixel well region;
a pixel ground line arranged above the pixel well region;
a pixel well contact connected between the pixel ground line and the pixel well region;
a plurality of pixels arranged to form a plurality of columns in the pixel well region and each configured to output a pixel signal;
a reference signal generation circuit configured to generate a reference signal; and
a plurality of readout circuits provided to corresponding ones of the plurality of columns, and each configured to receive the pixel signal from the pixels on a corresponding column and the reference signal,
wherein each of the plurality of readout circuits includes
a differential amplifier circuit having a first input node that receives the pixel signal and a second input node,
a first capacitor unit connected between the reference signal generation circuit and the second input node, and
a second capacitor unit connected between the second input node and the pixel ground line.

17. An imaging system comprising:
the photoelectric conversion device according to claim 1; and
a signal processing unit that processes a signal output from the photoelectric conversion device.

18. An imaging system comprising:
the photoelectric conversion device according to claim 16; and
a signal processing unit that processes a signal output from the photoelectric conversion device.

19. A movable object comprising:
the photoelectric conversion device according to claim 1;
a distance information acquisition unit that acquires distance information on a distance to an object, from a parallax image based on signals from the photoelectric conversion device; and
a control unit that controls the movable object based on the distance information.

20. A movable object comprising:
the photoelectric conversion device according to claim 16;
a distance information acquisition unit that acquires distance information on a distance to an object, from a parallax image based on signals from the photoelectric conversion device; and
a control unit that controls the movable object based on the distance information.

* * * * *